United States Patent [19]

Suzuki

[11] Patent Number: 4,651,065
[45] Date of Patent: Mar. 17, 1987

[54] JITTER-FREE SWEEP GENERATOR FOR A CATHODE RAY OSCILLOSCOPE

[75] Inventor: Tatsumi Suzuki, Urayasu, Japan

[73] Assignee: Iwatsu Electric Co., Ltd., Tokyo, Japan

[21] Appl. No.: 762,880

[22] Filed: Aug. 6, 1985

[30] Foreign Application Priority Data

Aug. 10, 1984 [JP] Japan ................. 59-168538

[51] Int. Cl.$^4$ .............................. H01J 29/70
[52] U.S. Cl. ..................... 315/399; 315/410
[58] Field of Search ............... 315/408, 410, 399, 367, 315/392, 370, 371; 340/731, 743; 364/487, 571; 324/121 R

[56] References Cited

U.S. PATENT DOCUMENTS

| 3,659,115 | 4/1972 | Montgomery | 315/410 |
| 3,706,904 | 12/1972 | Mordan | 315/399 |
| 3,836,851 | 9/1974 | Schumann | 315/367 |
| 4,007,400 | 2/1977 | Sutton | 315/364 |
| 4,109,182 | 8/1978 | Dalton | 315/392 |
| 4,251,754 | 2/1981 | Navarro et al. | 315/367 |
| 4,529,916 | 7/1985 | Nozawa | 315/392 |
| 4,555,765 | 11/1985 | Crooke et al. | 315/367 |

FOREIGN PATENT DOCUMENTS

| 968062 | 5/1975 | Canada | 315/399 |
| 1019340 | 5/1983 | U.S.S.R. | 315/399 |

Primary Examiner—Theodore M. Blum
Assistant Examiner—D. Cain
Attorney, Agent, or Firm—Woodcock Washburn Kurtz Mackiewicz & Norris

[57] ABSTRACT

A sweep generator for the delivery of a sweep signal to a deflection system (typically horizontal) of a cathode ray tube, including a sawtooth generator for generating a sawtooth waveform containing a ramp which determines the duration of each sweep. A frequency divider such as a D flip flop is connected to a trigger circuit for generating, when enabled by a holdoff signal, output pulses whose recurrence rate is a submultiple of that of the incoming trigger pulses. Also when enabled by the holdoff signal, a sweep gating flip flop responds to the first output pulse from the frequency divider for causing the sawtooth generator to generate the sweep ramp. Thus, since the sweep gating flip flop does not directly responds to the trigger pulses, but to the output pulses of the frequency divider, no jitter is to take place if the holdoff signal acquires a prescribed state for sweep initiation concurrently with a trigger pulse. An additional embodiment is disclosed which includes a pseudotrigger pulse generator for affording a higher sweep frequency when the trigger frequency is low.

8 Claims, 9 Drawing Figures

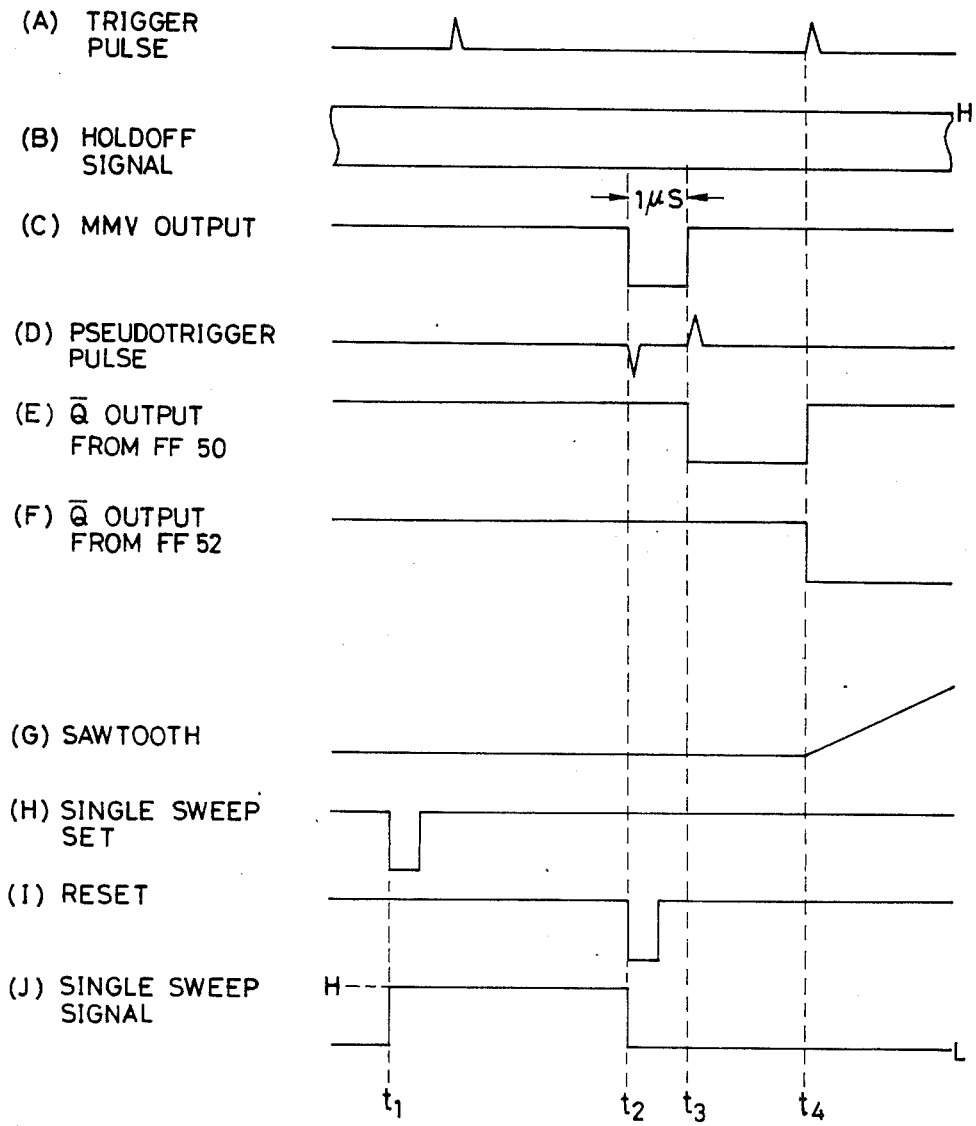

JITTER-FREE SWEEP GENERATOR FOR A CATHODE RAY OSCILLOSCOPE

BACKGROUND OF THE INVENTION

This invention relates to cathode ray oscilloscopes (CROs) in general and, in particular, to a sweep generator for generating a sawtooth sweep signal for application, typically as a time base, to a deflection system of a cathode ray tube (CRT) forming a part of the CRO. The invention pertains more specifically to such a sweep generator featuring provisions for eliminating the small, rapid variations in the CRT waveform display which are known to the specialists as jitter.

In a typical conventional sweep generator (shown in FIG. 1 of the drawings attached hereto), a sweep gate as in the form of a flip flop responds to the first incoming trigger pulse after a holdoff signal has acquired a predetermined state, as by going low. The sweep gate when so set causes a sawtooth generator to generate a sweep ramp, which is applied to the deflection plates (usually horizontal) of the CRT to give a beam displacement across the screen.

A problem with this type of sweep generator is that the sweep gating flip flop becomes unstable in operation a trigger pulse is supplied concurrently with the moment when the holdoff signal goes low. The unstability of the sweep gating flip flop manifests itself as the jitter of the display on the CRT screen.

One known expedient for eliminating the jitter has been to connect a tunnel diode between the output line of the holdoff circuit and ground for a faster switching speed. A change in value of the holdoff signal will concur less with the trigger pulses, so that jitter will become less pronounced. However, the tunnel diode is expensive, thermally unstable, and not fully reliable in operation.

Another conventional remedy for the problem has been the use of two sweep gating flip flops (FIG. 2). Both flip flops directly input the trigger pulses. The first flip flop further has a reset input connected to the holdoff circuit, whereas the second flip flop has a reset input connnected to the first flip flop and has an output connected to the sawtooth generator. The second flip flop causes the sawtooth generator to produce a sweep ramp in response to the second trigger pulse after the holdoff signal has gone low. Since the second flip flop is thus never triggered at the same time when the holdoff signal goes low, no jitter is to take place due to this reason.

However, the above second conventional solution has the following weaknesses:

1. Two flip flops are required that can both respond to the trigger pulses of a high recurrence rate.
2. The trigger circuit must feed the two flip flops with one and the same trigger signal.
3. In high frequency operation a setup time of approximately one nanosecond is required from the moment the second flip flop is released from the reset state to the moment it becomes capable of accepting trigger pulses. Another approximately one nanosecond is required from the moment the first flip flop is triggered to the moment its output changes accordingly. Thus the second flip flop tends to become unstable in operation at a frequency of approximately 500 megahertz, a reciprocal of the sum (about two nanoseconds) of the above two delay periods. This unstable operation of the second flip flop has frequently resulted in jitter in the neighborhood of that frequency.

SUMMARY OF THE INVENTION

The present invention provides a simple, inexpensive and thoroughly practicable solution to the problem of how to prevent jitter in the triggered sweep operation of a CRO.

Stated in brief, the invention provides a sweep generator for generating a sweep signal for delivery to a deflection system of a CRT incorporated in a CRO. The sweep generator comprises a sawtooth generator for generating the sweep signal of sawtooth waveform containing a ramp portion which determines the duration of each sweep and a return portion which determines a sweep recovery time. Associated with the sawtooth generator is a holdoff circuit for generating a holdoff signal which acquires a first prescribed state (for inhibiting the sweep generator) upon expiration of each sweep duration and which changes from the first to a second prescribed state (fow enabling the sweep generator) at least after the expiration of the sweep recovery time. A frequency divider inputs trigger pulses for producing, only when the holdoff signal is in the second or enabling state, output pulses whose recurrence rate is a submultiple of that of the trigger pulses. A sweep gating flip flop has inputs connected to the holdoff circuit and to the frequency divider and has an output connected to the sawtooth generator. The sweep gating flip flop causes the sawtooth generator to generate the sweep ramp in response to the first pulse put out by the frequency divider after the holdoff signal has changed from the first to the second prescribed state, and inhibits the sawtooth generator in response to the change of the holdoff signal from the second to the first prescribed state.

Thus, unlike the prior art, the sweep gating flip flop of the sweep generator in accordance with the invention does not directly input the trigger pulses but via the frequncy divider. Consequently, the sweep gating flip flop does not directly respond to a trigger pulse that may be suplied concurrently with the change of the holdoff signal from the first to the second state. No jitter is therefore to occur for this cause.

The frequency divider which precedes the sweep gating flip flop can also take the form of a flip flop in practice, so that the sweep generator of this invention may also employ two flip flops. It is, however, only the frequency dividing flip flop that directly inputs the trigger pulses. The sweep gating flip flop must respond only to the frequency divider output, which of course has a much lower recurrence rate than that of the trigger pulses. The sweep generator of this invention is therefore free from all the listed drawbacks of the prior art. It will also be appreciated that low frequency flip flops are generally cheaper than those responding to higher frequencies.

According to a further feature of this invention, a pseudotrigger pulse generator is provided which delivers pseudotrigger pulses to the frequency dividing flip flop when enabled by the holdoff signal. When the recurrence rate of the actual trigger pulses being supplied to the sweep generator is less than a predetermined value, the frequency divider responds to a pseudotrigger pulse, instead of to an actual trigger pulse, which can be supplied earlier than the actual trigger pulse after the frequency divider, as well as the sweep gate, has been enabled by the holdoff signal. The result, of course, is a quicker production of a sweep ramp by the sawtooth generator. The faster repetition of sweeps thus realized when the trigger frequency is low is effective to prevent the flicker or reduction in intensity of the waveform display on the CRT screen.

The above and other features and advantages of this invention and the manner of realizing them will become more apparent, and the invention itself will best be understood, from a study of the following description and appended claims, with reference had to the attached drawings showing the preferred embodiments of the invention as well as the noted prior art.

BRIEF DESCRIPTION OF THE DRAWINGS

FIG. 9 is a diagram showing waveforms appearing in the various parts of the sweep generator of FIG. 7 in order to explain its operation in a single sweep mode.

DETAILED DESCRIPTION

Figure 1:
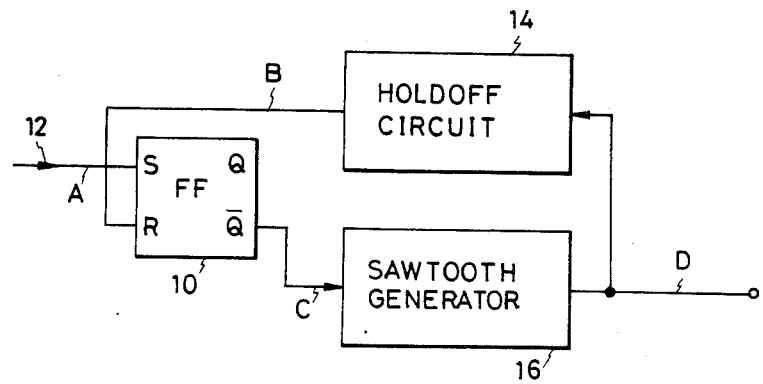
FIG. 1 is a block diagram of a typical conventional sweep generator.

The features and advantages of the present invention will be better understood from a consideration of the typical prior art sweep generator of FIG. 1. It includes a flip flop 10 which functions as a sweep gate, having a set input S connected to a trigger pulse input line 12 and a reset input R connected to a holdoff circuit 14. The inverting output $\overline{Q}$ of the flip flop 10 is connected to a sawtooth generator 16.

Figure 2:
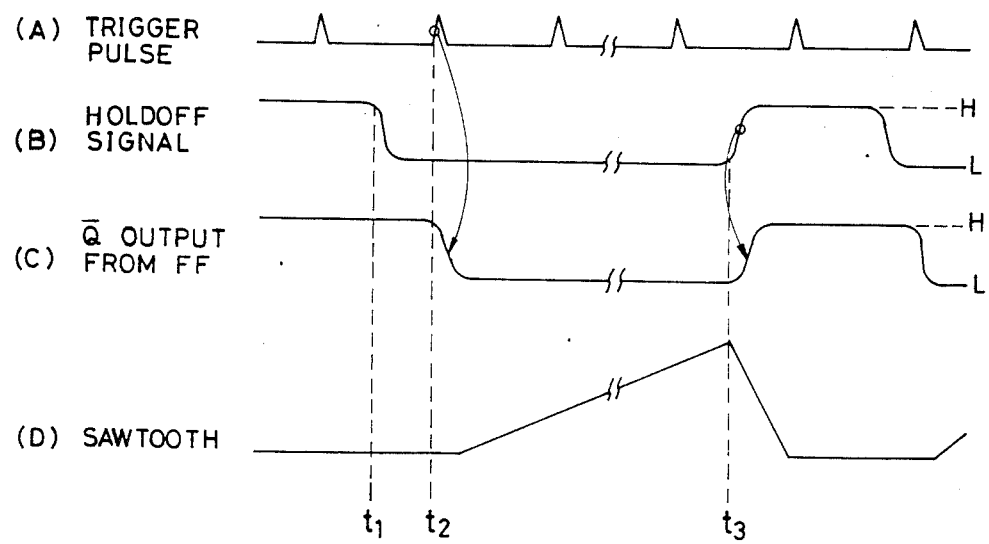
FIG. 2 is a diagram showing waveforms appearing in the various parts of the prior art sweep generator of FIG. 1 in order to explain its operation.

FIG. 2 represents, at (A) through (D), the waveforms appearing in the various parts of the prior art sweep generator of FIG. 1. The parts where these waveforms appear are indicated by the corresponding capitals A through D in FIG. 1. Shown at (A) in FIG. 2 are a train of trigger pulses formed from the input signal to be observed by the CRO. The holdoff circuit 14 delivers to the flip flop 10 the holdoff signal shown at (B) in FIG. 2. The holdoff signal resets the flip flop 10 when high (H), so that the $\overline{Q}$ output from the flip flop 10 goes low (L), at a moment t2 in FIG. 2, in response to the first trigger pulse incoming after the holdoff signal has gone low at a moment t1. Thereupon the sawtooth generator 16 starts generating a sweep ramp as at (D) in FIG. 2.

As has been stated, jitter will take place on the fluorescent screen of the CRT if the shift of the holdoff signal from its high to low state coincides in time with one of the trigger pulses, that is, if there is no time lag from moment t1 to moment t2 in FIG. 2. This is generally attributed to the instability in the shifting of the flip flop output from the high to the low state. The jitter will be inconspicuous and so will present no serious problem if the recurrence rate of the trigger pulses is less than approximately 100 megahertz and the sweep speed is less than the order of nanoseconds per division. However, when the trigger pulses are being supplied at a higher recurrence rate, and the sweep speed is also higher, the signal waveform on the screen will either double or blur to the annoyance of the observer.

Figure 3:
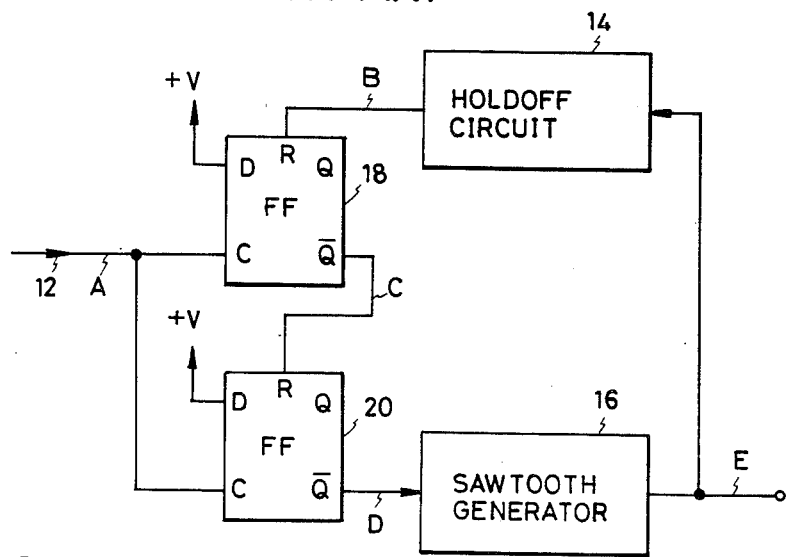
FIG. 3 is a block diagram of another conventional sweep generator, showing an example of means heretofore employed to remedy the problem encountered with the prior art sweep generator of FIG. 1.

FIG. 3 illustrates the aforesaid second conventional solution to the above problem, the first conventional solution having been the use of a tunnel diode. This second known solution suggests the use of two D flip flops 18 and 20 which function in combination as a sweep gate. Each flip flop has a clock input C connected to the trigger input line 12, and a data input D connected to a positive power supply +V. The first flip flop 18 has a reset input R connected to the holdoff circuit 14, whereas the second flip flop 20 has a reset input R connected to the inverting output $\overline{Q}$ of the first flip flop 18. The inverting output $\overline{Q}$ of the second flip flop 20 is connected to the sawtooth generator 16.

Figure 4:
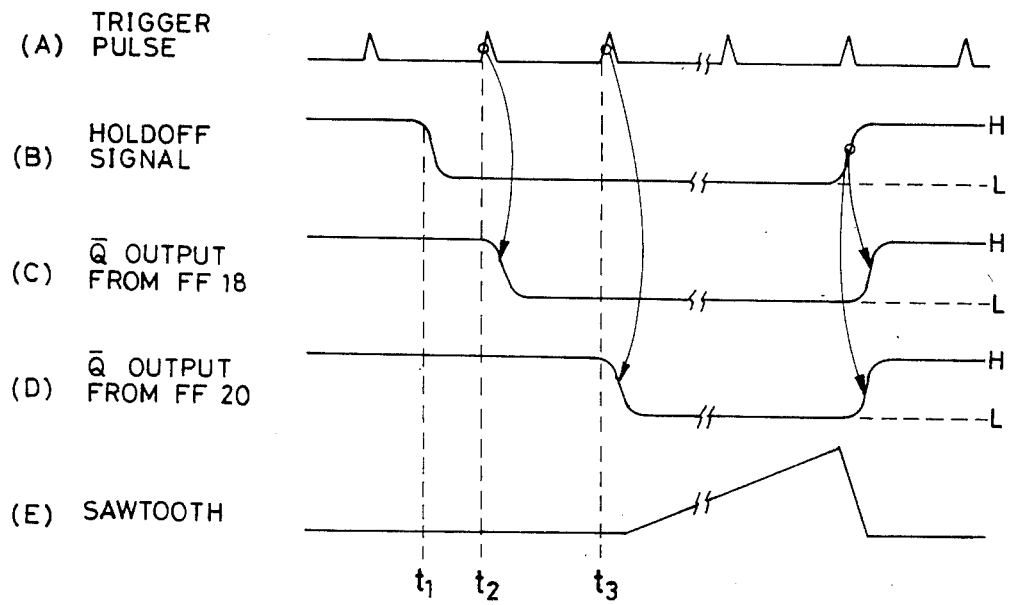
FIG. 4 is a diagram showing waveforms appearing in the various parts of the prior art sweep generator of FIG. 3 in order to explain its operation.

The letters A through E in FIG. 3 indicate the parts where the corresponding waveforms (A) through (E) of FIG. 4 appear. As the holdoff signal goes low at a moment t1, as at (B) in FIG. 4, the first flip flop 18 is set by the first trigger pulse incoming, at a moment t2, after the moment t1, so that the $\overline{Q}$ output from the first flip flop goes low as at (C) in FIG. 4. Although this same trigger pulse is also impressed to the clock input C of the second flip flop 20, the latter is not set thereby as the $\overline{Q}$ output from the first flip flop goes low slightly later than the moment t2. The next trigger pulse sets the second flip flop 20 at a moment t3, as at (D) in FIG. 4, whereupon the sawtooth generator 16 starts generating the ramp voltage as at (E) in FIG. 4.

Thus the second flip flop 20 of this prior art sweep generator responds to the second trigger pulse (at the moment t3) following the moment t1 when the holdoff signal goes low. These moments t1 and t3 are never to concur, so that jitter is usually not to occur on the CRT screen. This solution is also unsatisfactory, however, for the reasons set forth previously.

FIRST EMBODIMENT OF THE INVENTION

Figure 5:
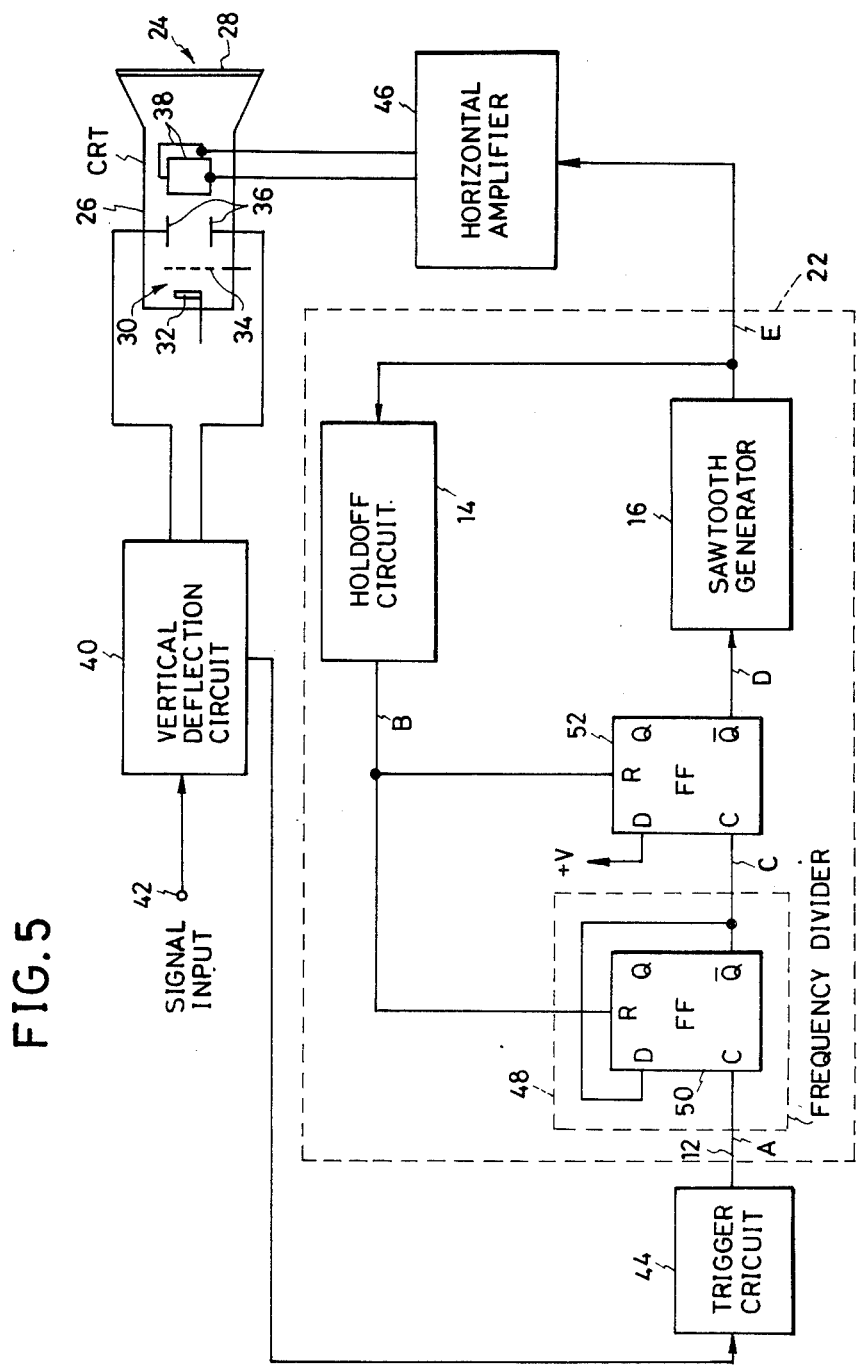
FIG. 5 is a block diagram of the CRO incorporating a preferred form of the sweep generator in accordance with the invention.

FIG. 5 illustrates a CRO incorporating a sweep generator 22 in accordance with the invention, which is free from all the noted weaknesses of the prior art. The capitals A through E in FIG. 5 denotes the circuit lines where the corresponding waveforms (A) through (E) of FIG. 6 appear.

The illustrated CRO has a CRT 24 for visual representation of the input signal. Although the CRT 24 is shown highly diagrammatically and as simply as possible because of its conventional nature, it will nevertheless be seen that the CRT has an evacuated envelope 26 having a target screen 28 at one end. Disposed at or adjacent the other end of the envelope 26 is an electron gun 30 comprising a cathode 32, a control grid 34, etc, for emitting a beam of electrons directed toward the screen 28. Disposed along the trajectory of the electron beam from electron gun 30 to target screen 28 are a first pair of deflection plates 36 for deflecting the beam in one of two orthogonal directions, and another pair of deflection plates 38 for deflecting the beam in the other of the orthogonal directions. The first pair of deflection plates 36 will hereinafter be referred to as the vertical deflection plates, and the second pair of deflection plates 38 as the horizontal deflection plates, in conformity with common parlance in the art.

The control grid 34 of the electron gun 30 is supplied with an intensity control signal (blanking or unblanking signal) from a standard beam control circuit (not shown). The pair of vertical deflection plates 36 are connected to a vertical deflection circuit 40 and thence to a signal input 42. The signal to be observed on the CRT screen 28 is thus fed through the vertical deflection circuit 40 to the vertical deflection plates 36. The pair of horizontal deflection plates 38 of the CRT 24 is supplied with a sweep signal from a horizontal deflection circuit set forth hereafter.

Included in the horizontal deflection circuit is a trigger circuit 44 of known configuration connected to the vertical deflection circuit 40. As is well known, the trigger circuit 44 generates a recurrent train of trigger pulses, shown at (A) in FIG. 6, which are derived from the input signal received at the signal input 42. The recurrence rate of the trigger pulses corresponds to the input frequency.

The trigger pulses are delivered via the trigger input line 12 to the sweep generator shown enclosed in the dashed outline labelled 22. The sweep generator 22 produces a sawtooth sweep signal, given at (E) in FIG. 6, in response to the incoming trigger pulses, for delivery to the pair of horizontal deflection plates 38 of the CRT 24 via a horizontal amplifier 46. The sweep generator 22 comprises the holdoff circuit 14 and sawtooth generator 16 as in the prior art. As will be seen from the waveform (E) in FIG. 6, the sawtooth sweep signal contains a ramp Vr, such that the output voltage increases linearly to a predetermined maximum value Vm, and a return Ve wherein the output voltage rapidly returns to an initial value Vo. It is the ramp Vr that determines the duration of each sweep. The return portion Ve determines the sweep recovery time. In FIG. 5, therefore, the period from moment t4 to moment t5 represents one sweep duration, and the subsequent period from moment t5 to moment t6 represents the sweep recovery time.

Figure 6:
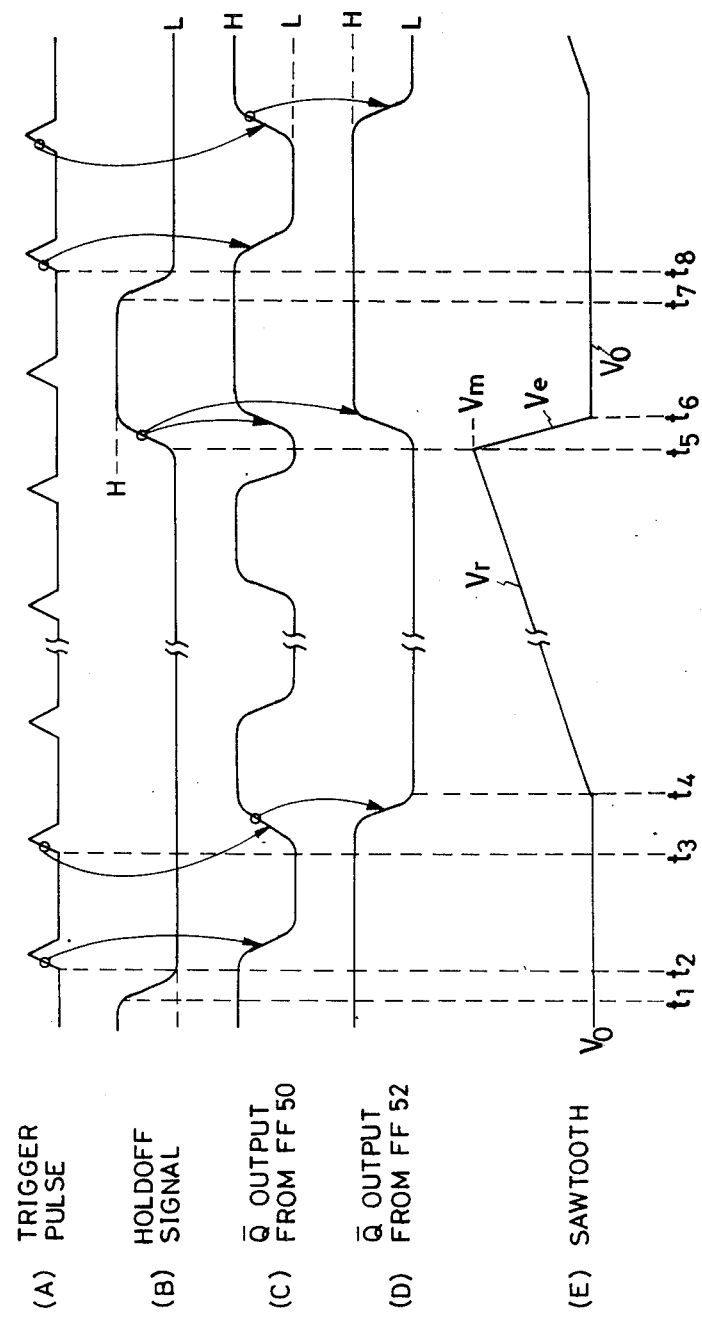
FIG. 6 is a diagram showing waveforms appearing in the various parts of the sweep generator of FIG. 5, the waveforms being useful in explaining the operation of the sweep generator.

Having an input connected to the sawtooth generator 16, the holdoff circuit 14 puts out a holdoff signal plotted at (B) in FIG. 6. The holdoff signal has a first prescribed state H, which determines a sweep holdoff interval during which the sweep generator 22 is inhibited, and a second prescribed state L during which the sweep generator is allowed to respond to the trigger pulses. A study of FIG. 6 will indicate that the holdoff circuit 14 is so associated with the sawtooth generator 16 that the holdoff signal goes high at the moment t5, when the sweep ram Vr is at the maximum Vm to terminates one sweep. It will also be seen that the subsequent holdoff interval covers, and in this embodiment lasts longer than, the sweep recovery time from moment t5 to moment t6.

The sweep generator 22 further includes a frequency divider 48 herein shown to comprise a D flip flop 50, connected directly to the trigger input line 12. The dividing ratio of the frequency divider 48 is ½ in this particular embodiment; that is, the frequency divider puts out one pulse with every two incoming trigger pulses, as will be understood from (A) and (C) in FIG. 6. The frequency dividing flip flop 50 has a clock input C onnected to the trigger input line 12, a data input D connected to an inverting output $\overline{Q}$, and a reset input R connected to the holdoff circuit 14.

Connected next to the frequency divider 48 is another D flip flop 52 which functions as a sweep gate. The sweep gating flip flop 52 has a clock input C connected to the inverting output $\overline{Q}$ of the frequency dividing flip flop 50, a data input D connected to a positive power supply +V, a reset input R connected to the holdoff circuit 14, and an inverting output $\overline{Q}$ connected to the sawtooth generator 16.

OPERATION OF FIRST EMBODIMENT

As the signal input 42 of the FIG. 5 CRO receives a signal to be observed on the CRT screen 28, the rigger circuit 44 delivers to the sweep generator 22 the train of trigger pulses, at (A) in FIG. 6, having a recurrence rate corresponding to the input signal frequency. However, the frequency dividing flip flop 50 remains reset as long as the output from the holdoff circuit 14 is high, so that the sweep generator 22 remains insensitive to the trigger pulses during the high state of the holdoff signal.

When the holdoff signal goes low at the moment t1, as at B in FIG. 6, the frequency dividing flip flop 50 starts generating output pulses at one half the recurrence rate of the incoming trigger pulses. More specifically, the $\overline{Q}$ output from the frequency dividing flip flop 50 goes low at the moment t2 in response to the first incoming trigger pulse after the moment t1. The first output pulse of the frequency divider 48 is formed as its $\overline{Q}$ output goes high in response to the second trigger pulse incoming at a moment t3 after the moment t1. The sweep gating flip flop 52 responds to the leading edge of the first frequency divider output pulse, with the result that the $\overline{Q}$ output from the sweep gating flip flop goes low as at (D) in FIG. 6. (Although the sweep gating flip flop 52 has its reset input R also connected to the holdoff circuit 14, the holdoff signal is now assumed to be low as at (B) in FIG. 6). The sawtooth generator 16 responds to this low output from the sweep gating flip flop 52 by putting out the sweep ramp voltage Vr as at (E) in FIG. 6. When the ramp voltage Vr builds builds up to the maximum value Vm at the moment t5, the holdoff circuit 14 responds by making its output signal high as at (B) in FIG. 6, with the result that the flip flops 50 and 52 are both reset as at (C) and (D) in FIG. 6. The sawtooth generator output subsequently returns to the initial value Vo at the moment t6. One sweep cycle has now been completed. The next cycle begins at the moment t7 when the holdoff signal goes low.

Let it be assumed that, in the sweep generator 22 of the foregoing configuration and operation, the holdoff signal at (B) in FIG. 6 goes low more or less concurrently with one of the trigger pulses at (A) in the same figure. Then the resulting change in the $\overline{Q}$ output from the frequency dividing flip flop 50 from its high to low state will become unstable in time.

This unstability will not, however, result in the jitter of the display on the CRT screen 28 since the output from the frequency dividing flip flop 50 does not directly initiate the production of the sweep ramp Vr by the sawtooth generator 16. Despite the unstability of the moment the $\overline{Q}$ output of the frequency dividing flip flop 50 goes low, it subsequently goes high at least after one trigger pulse cycle following the moment the holdoff signal has gone low. The moment the clock input of the sweep gating flip flop 52 goes high is never to coincide with the moment the holdoff signal goes low. The sawtooth output from the sawtooth generator 16 can thus be produced properly to make possible jitter-free display on the CRT screen 28.

The sweep generator 22 in accordance with the invention employs two flip flops 50 and 52 like the prior art sweep generator of FIG. 3. It is, however, only the frequency dividing flip flop 50 that directly receives the trigger pulses. The sweep gating flip flop 52 inputs the output pulses from the frequency dividing flip flop 50 whose recurrence rate is a submultiple of that of the trigger. pulses. The maximum operating frequency of the sweep gating flip flop 52 can thus be materially lower than that of the frequency dividing flip flop 50.

It will also be appreciated that the trigger circuit 44 is required to feed only the frequency dividing flip flop 50. The load imposed thereon is therefore much lower than if the trigger circuit feeds two flip flops as in the case of the prior art sweep generator of FIG. 3.

SECOND EMBODIMENT

Figure 7:
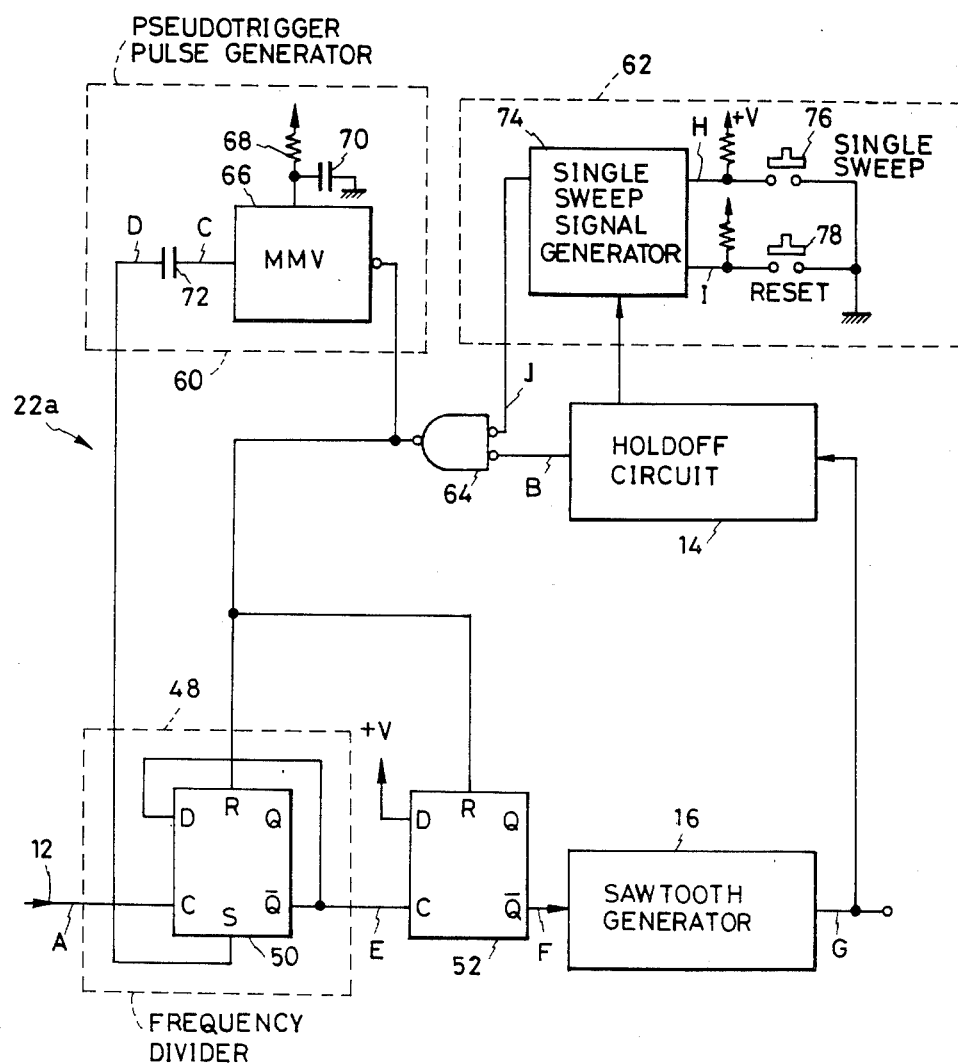
FIG. 7 is a block diagram of another preferred form of the sweep generator in accordance with the invention, for use in the CRO of FIG. 5 in substitution for the first preferred form of the sweep generator illustrated therein.
Figure 8:
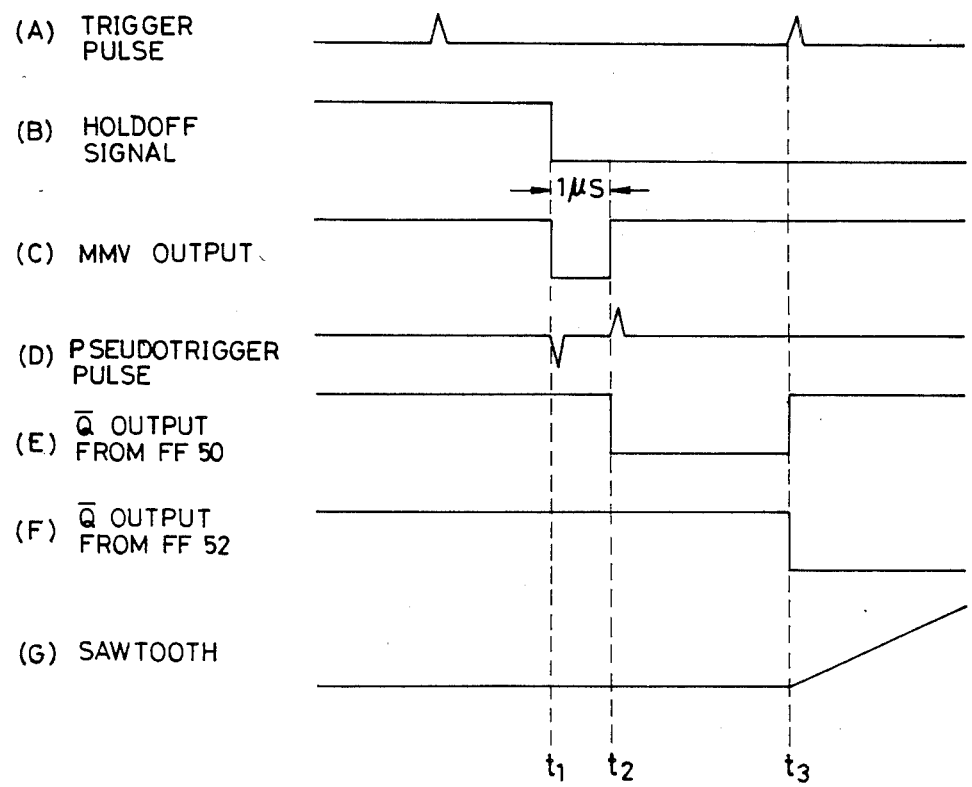
FIG. 8 is a diagram showing waveforms appearing in the various parts of the sweep generator of FIG. 7 in order to explain its operation in a low frequency triggered sweep mode.

FIG. 7 shows another preferred form of the sweep generator in accordance with the invention, for use in the CRO of FIG. 5 in substitution for the sweep generator 22. Generally designated 22a, the alternative sweep generator is equipped for different modes of operation depending upon whether the recurrence rate of the trigger pulses is above or below a predetermined value, as well as for single sweep operation. The sweep generator 22a comprises a pseudotrigger pulse generator 60, a single sweep control circuit 62, and an OR gate 64 of the negative logical AND type, in addition to the components already set forth in conjunction with the sweep generator 22. The waveforms appearing in the parts A through J of this alternative sweep generator are illustrated at (A) through (G) in FIG. 8 and at (A) through (J) in FIG. 9. FIG. 8 is explanatory of the triggered sweep operation of the sweep generator when the trigger pulses have a recurrence rate less than the predetermined value. FIG. 9 is explanatory of operation in the single sweep mode.

The pseudotrigger pulse generator 60 comprises a one-microsecond monostable multivibrator (MMV) 66 having a trigger input connected to the OR gate 64, to be triggered as the OR gate output goes low. The MMV 66 is provided with a resistor 68 and a capacitor 70 for the determination of its time constant. The output of the MMV 66 is connected to a differentiating capacitor 72, another component of the pseudotrigger pulse generator 60, and thence to the set input S of the flip flop 50 of the frequency divider 48.

The single sweep control circuit 62 includes a single sweep signal generator 74 of known design comprising a flip flop. Connected to the inputs of the single sweep signal generator circuit 74 are a single sweep switch 76 and reset switch 78, which are both normally open and which are to be closed for setting the sweep generator in the single sweep mode and for resetting the circuit, respectively. The single sweep signal generator 74 is connected to one of the two inputs of the OR gate 64, to the other input of which is connected the holdoff circuit 14. Consequently, the output from the OR gate 64 goes high when either of the single sweep signal and the handoff signal is high. Besides being connected to the MMV 66, the output is the OR gate 64 is connected to the reset inputs R of both frequency dividing flip flop 50 and sweep gating flip flop

OPERATION OF SECOND EMBODIMENT

The sweep generator 22a operates just like the sweep generator 22 of FIG. 5 if the recurrence rate of the trigger pulses received at the trigger input 12 is over one megahertz, which is a reciprocal of one microsecond, and if the single sweep signal generator 74 is held reset. That is because neither pseudotrigger pulse generator 60 nor single sweep control circuit 62 take part in controlling the production of the sawtooth sweep signal.

The pseudotrigger pulse generator 60 does take part in controlling the production of the sawtooth sweep signal if the recurrence rate of the incoming trigger pulses is less than one megahertz. How the pseudotrigger pulse generator 60 participates in the controlled production of the sweep signal will become understood from a study of the waveforms of FIG. 8, which are plotted on the assumption that the output from the single sweep signal generator 74 is held low for the regular sweep mode.

The trigger pulses of the above relatively low recurrence rate are given at (A) in FIG. 8. As the holdoff signal from the circuit 14 goes low at a moment t1, as at (B) in FIG. 8, so does the output from the OR gate 64. Thereupon the frequency dividing flip flop 50 and sweep gating flip flop 52 become no longer reset, and the MMV 66 of the pseudotrigger pulse generator 60 is also triggered to produce a "negative" pulse of one microsecond duration terminating at a moment t2, as at (C) in FIG. 8. At the trailing edge of the "negative" pulse the differentiating capacitor 72 puts out a pseudotrigger pulse as at (D) in FIG. 8. This pseudotrigger pulse is impressed to the set input S of the frequency dividing flip flop 50, with the result that this flip flop becomes set just as if it were triggered by one of the trigger pulses shown at (A) in FIG. 8. Thus the $\overline{Q}$ output from the frequency dividing flip flop 50 goes low at the moment t2, as at (E) in FIG. 8.

Then, as the first trigger pulse after the moment t1 is impressed to the clock input C of the frequency dividing flip flop 50 at a moment t3, as at A in FIG. 8, the $\overline{Q}$ output therefrom goes high as at (E) in FIG. 8. As has been set forth with reference to the waveform diagrams of FIG. 6, which are explanatory of the operation of the sweep generator 22 of FIG. 5, the $\overline{Q}$ output from the sweep gating flip flop 52 goes low when the output from the frequency dividing flip flop 50 goes high. Thus, in this second embodiment, the output from the sweep gating flip flop 52 goes low at the moment t3, as at (F) in FIG. 8, thereby causing the sawtooth generator 16 to start generating the voltage ramp for the commencement of a sweep as at (G) in FIG. 8.

The foregoing will have made clear that the sweep generator 22a starts generating the voltage ramp in response to the first trigger pulse after the holdoff signal has gone low, instead of to the second trigger pulse (see FIG. 6) as in the FIG. 5 embodiment, if the trigger pulse frequency is less than one megahertz. This of course is because the pseudotrigger pulse at (D) in FIG. 8 serves the purpose of the first actual trigger pulse at the moment t2 in FIG. 6. Were it not for this pseudotrigger pulse, the sweep generator 22a would generate a sweep ramp in response to the second trigger pulse after the holdoff signal had gone low. In that case, since the trigger pulse frequency is relatively low, the signal waveform on the CRT screen would either flicker or decrease in intensity. No such problem will occur if the sweep ramp is generated in response to the first trigger pulse after the holdoff signal has gone low, as in the FIG. 7 embodiment, because of the higher sweep frequency thus realized.

Jitter will take place if the pseudotrigger pulse at (D) in FIG. 8 is generated more or less at the same time with an actual trigger pulse during the above low trigger frequency operation of the sweep generator 22a. However, this jitter will hardly affect the observation of the signal waveform when the trigger frequency is low.

The operation of the sweep generator 22a in the single sweep mode will become apparent from a consideration of the waveforms of FIG. 9. Upon activation of the single sweep switch 76 of the single sweep control circuit 62 at a moment t1 in FIG. 9, the resulting low input, given at (H) in FIG. 9, to the single sweep signal generator 74 will cause its output to go high as at (J) in FIG. 9. This single sweep signal is impressed via the OR gate 64 to the reset inputs R of both frequency dividing flip flop 50 sweep gating flip flop 52. So reset, the frequency dividing flip flop 50 will become insensitive to the trigger pulses shown at (A) in FIG. 9. Then, upon activation of the reset switch 78 of the single sweep control circuit 62 at a subsequent moment t2, as at (I) in FIG. 9, the single sweep signal from its generator 74 will go low as at (J) in FIG. 9.

Triggered at the moment t2 by the single sweep signal of the low state via the OR gate 64, the MMV 66 of the pseudotrigger pulse generator 60 will put out a "negative" pulse of one microsecond duration as at (C) in FIG. 9, just as it does when the holdoff signal goes low in the low trigger frequency mode of operation (see FIG. 8) of this sweep generator 22a. The differentiating capacitor 72 of the pseudopulse generator 60 will put out a pseudotrigger pulse upon expiration of the "negative" pulse at a moment t3, as at (D) in FIG. 9. This pseudotrigger pulse is delivered to the frequency dividing flip flop 50 for setting same as at (E) in FIG. 9.

Upon appearance of a trigger pulse at a subsequent moment t4, as at (A) in FIG. 9, the output from the frequency dividing flip flop 50 will go high, as at (E) in FIG. 9, with the result that the output from the sweep gating flip flop 52 goes low as at (F) in FIG. 9. The sawtooth generator 16 will respond to this low output from the sweep gate to start generating the sweep voltage ramp as at (G) in FIG. 9. The holdoff circuit 14 has an input connected to the sawtooth generator 16. Upon ramp production by the sawtooth generator 16, the holdoff circuit 14 responds to cause the single sweep control circuit 62 to make the single sweep signal high, so that the sweep is inhibited unless the reset switch 78 is reactivated.

Thus the sweep generator 22a is equipped to quickly commence each single sweep operation in response to one trigger pulse.

POSSIBLE MODIFICATIONS

Although the present invention has been shown and described hereinbefore in terms of but two preferable embodiments thereof, it is recognized that the invention could be embodied in other forms within the broad teaching hereof. The following, then, is a brief list of possible modifications or alterations of the illustrated embodiments that are believed to fall within the scope of this invention.

1. The frequency dividing ratio of the frequency divider need not be ½ as in the illustrated embodiments. For instance, if the frequency dividing ratio of the flip flop 50 is set at 1/10 in the sweep generator 22 of FIG. 5, a sweep will start at the tenth trigger pulse following the moment the holdoff signal goes low. If the frequency dividing ratio of the flip flop 50 is set at 1/10 (1/n) in the sweep generator 22a of FIG. 7, on the other hand, then the pseudotrigger pulse generator 60 should be so constructed as to generate nine (n−1) pseudotrigger pulses in response to the going low of the output from the OR gate 64. Then the sweep generator 22a will start generating a sweep ramp at the tenth pseudotrigger pulses if the trigger frequency is high, and at the nineth pseudotrigger pulse if the trigger frequency is low or if the generator is in the single sweep mode. The interval of the pseudotrigger pulses should be shorter than that of the expected low frequency trigger signal.

2. Not D flip flops but RS or other types of flip flops may be employed as the frequency divider and the sweep gate.

3. The pseudotrigger pulses from the generator 60 in the FIG. 7 sweep generator 22a may be impressed to the clock input C of the frequency dividing flip flop 50, instead of to its set input S.

4. In the sweep generator 22 the operation of the frequency divider 48 from moment t3 to moment t7 in FIG. 6 has no bearing to the production of the sweep signal, so that the frequency divider may be held out of operation during such periods.

5. In the sweep generator 22a the pseudotrigger pulse generator 60 and single sweep control circuit 62 may be selectively switched into and out of connection with the rest of the sweep generator circuitry.

6. The sawtooth generator 16 may be of bootstrap configuration.

What is claimed is:

1. In a cathode ray oscilloscope having a cathode ray tube for visual representation of an input signal, a sweep generator for generating a sweep signal for delivery to a deflection system of the cathode ray tube, the sweep generator comprising:
  (a) a source of recurrent trigger pulses derived from the input signal;
  (b) a sawtooth generator for generating the sweep signal of sawtooth waveform containing a ramp portion which determines the duration of each sweep and a return portion which determines the sweep recovery time;
  (c) a holdoff circuit for generating a holdoff signal having a first prescribed state for inhibiting the sweep generator and a second prescribed state for enabling the sweep generator, the holdoff circuit being so associated with the sawtooth generator that the holdoff signal acquires the first prescribed state upon expiration of each sweep duration and changes from the first to the second prescribed state at least upon expiration of the sweep recovery time;
  (d) a frequency divider connected to both the trigger pulse source and the holdoff circuit for producing, when the holdoff signal is in the second prescribed stae, output pulses whose recurrence rate is a submultiple of the recurrence rate of the trigger pulses, the holdoff signal when in the first state being effective to render the frequency divider insensitive to the trigger pulses; and (e) a sweep gating flip flop connected between the frequency divider and the sawtooth generator and further connected to the holdoff circuit to be controlled thereby, the sweep gating flip flop generating a sweep gating signal having a third prescribed state for inhibiting the sawtooth generator and a fourth prescribed state for enabling the sawtooth generator to produce the ramp portion of the sawtooth sweep signal, the sweep gating signal changing from the third to the fourth prescribed state in response to the first output pulse generated by the frequency divider after the holdoff signal has changed from the first to the second prescribed state, and changing from the fourth to the third prescribed state in response to the change of the holdoff signal from the second to the first prescribed state.

2. A cathode ray oscilloscope as set forth in claim 1, wherein the frequency divider comprises a D flip flop having:
(a) a clock input connected to the source of trigger pulses;
(b) a reset input connected to the holdoff circuit;
(c) a data input; and
(d) an inverting output connected to the data input and to the sweep gating flip flop.

3. A cathode ray oscilloscope as set forth in claim 2, wherein the sweep generator further comprises a positive power supply, and wherein the sweep gating flip flop is a D flip flop having:
(a) a clock input connected to the inverting output of the flip flop of the frequency divider,
(b) a reset input connected to the holdoff circuit;
(c) a data input connected to the positive power supply; and
(d) an inverting output connected to the sawtooth generator.

4. A cathode ray oscilloscope as set forth in claim 1, further comprising a pseudotrigger pulse generator connected between the holdoff circuit and the frequency divider for affording a higher sweep frequency when the recurrence rate of the trigger pulses is less than a predetermined value, the pseudotrigger pulse generator being adapted to deliver (n−1) pseudotrigger pulses (where n is the reciprocal of the frequency dividing ratio of the frequency divider) to the frequency divider in response to the change of the holdoff signal from the first to the second prescribed state, the frequency divider responding to the pseudotrigger pulses in the same way as to the trigger pulses, the time period from the change of the holdoff signal from the first to the second prescribed state to the production of the last of the resulting pseudotrigger pulses being shorter than the spacing of the trigger pulses when the recurrence rate of the trigger pulses is less than the predetermined value.

5. A cathode ray oscilloscope as set forth in claim 4, wherein the pseudotrigger pulse generator comprises:
(a) a monostable multivibrator adapted to be triggered in response to the change of the holdoff signal from the first to the second prescribed state; and
(b) a differentiator connected between the monostable multivibrator and the frequency divider.

6. A cathode ray oscilloscope as set forth in claim 5, wherein the frequency divider comprises a D flip flop having:
(a) a clock input connected to the source of trigger pulses;
(b) a set input connected to the differentiator of the pseudotrigger pulse generator;
(c) a reset input connected to the holdoff circuit;
(d) a data input; and
(e) an inverting output connected to the data input and to the sweep gating flip flop;
and wherein the sweep generator further comprises a positive power supply, and the sweep gating flip flop is a D flip flop having:
(a) a clock input connected to the inverting output of the flip flop of the frequency divider;
(b) a reset input connected to the holdoff circuit;
(c) a data input connected to the positive power supply; and
(d) an inverting output connected to the sawtooth generator.

7. A cathode ray oscilloscope as set forth in claim 6, further comprising:
(a) a single sweep control circuit having means for setting the sweep generator in a single sweep mode, the signal sweep control circuit generating a single sweep signal of the first prescribed state when the sweep generator is set in the single sweep mode, the single sweep control circuit further having reset means whereby the single sweep signal can be changed from the first to the second prescribed state; and
(b) a logic gate allowing the passage therethrough of both the holdoff signal and the single sweep signal, the logic gate having an output connected to the reset inputs of both the D flip flop of the frequency divider and the sweep gating D flip flop and further to a trigger input of the monostable multivibrator of the pseudotrigger pulse generator.

8. A cathode ray oscilloscope as set forth in claim 7, wherein the logic gate is an AND type OR gate.

* * * * *